United States Patent [19]

Ishida

[11] Patent Number: 5,544,177
[45] Date of Patent: Aug. 6, 1996

[54] VITERBI DECODING METHOD AND VITERBI DECODING APPARATUS

[75] Inventor: Katsuhito Ishida, Kanagawa, Japan

[73] Assignee: Sony Corporation, Tokyo, Japan

[21] Appl. No.: 165,852

[22] Filed: Dec. 14, 1993

[30] Foreign Application Priority Data

Dec. 22, 1992 [JP] Japan ..................... 4-356798

[51] Int. Cl.⁶ .................................................. H03M 13/12
[52] U.S. Cl. .................................................... 371/43
[58] Field of Search ................................... 371/43

[56] References Cited

U.S. PATENT DOCUMENTS

| | | | |
|---|---|---|---|
| 3,622,986 | 11/1971 | Tang ............................................ | 371/56 |
| 4,644,564 | 2/1987 | Dolivo et al. .............................. | 375/18 |
| 4,837,766 | 6/1989 | Yoshida ..................................... | 371/46 |

FOREIGN PATENT DOCUMENTS

| | | |
|---|---|---|
| 392603 | 10/1990 | European Pat. Off. . |
| 552781 | 7/1993 | European Pat. Off. . |
| 84/04640 | 11/1984 | WIPO . |
| 91/06165 | 5/1991 | WIPO . |

OTHER PUBLICATIONS

Ferguson, M., "Optimal Reception for Binary Partial Response Channels", *Bell System Technical Journal*, vol. 51, No. 2, Feb. 1972, pp. 493–505.

Kobayashi H., "Application of Probabilistic Decoding to Digital Magnetic Recording Systems", *IBM J. Res. Develop.*, Jan. 1971, pp. 64–74

Ferguson, M., "Optimal Reception for Binary Partial Response Channels", *The Bell System Technical J.*, Feb. 1972, pp. 493–505.

*Primary Examiner*—Stephen M. Baker
*Attorney, Agent, or Firm*—William S. Frommer; Alvin Sinderbrand

[57] ABSTRACT

In a Viterbi decoding method or apparatus, a reception code, produced by precoding a transmission code and transmitting the precoded transmission code through a partial response transmission path, is processed to detect whether the present state is a plus (+) merge, a minus (−) merge or a no merge state. A provisional value is estimated for the transmission code corresponding to the reception code, and the provisional value is stored in a buffer. When the present state is a (+) or (−) merge, that is, other than a no merge state, a decoded value is obtained for the transmission code and the provisional value in the buffer is updated with the decoded value.

8 Claims, 9 Drawing Sheets

VITERBI DECODING METHOD AND VITERBI DECODING APPARATUS

BACKGROUND OF THE INVENTION

The present invention relates to a method and apparatus for reducing the error rate of received data, and, more particularly, is directed to Viterbi decoding of encoded data.

The Viterbi algorithm is used to estimate the values of a sequence of received information. The information values may be chosen from a binary set, such as (0, 1), and sampled at discrete times. Typically, the information sequence is transmitted through a channel which adds memoryless noise thereto. At a receiver, the original sequence of information is extracted from the received information, as corrupted by noise introduced by the transmission channel.

A version of the Viterbi decoding algorithm, referred to herein as Ferguson's technique, has been proposed in M. J. Ferguson, "Optimal reception for binary partial response channels", Bell System Technical Journal, Vol. 51, No 2, pages 493–505, February 1972, the disclosure of which is incorporated by reference herein.

Ferguson explains that a partial response signalling scheme is useful as it eliminates the need for ideal boxcar filters. Since not all code sequences are possible when using a partial response signalling scheme, it is appropriate to consider the received sequence as a trellis of binary points, and determine the trellis path of maximum likelihood. At each point in time, there are two maximum likelihood paths respectively leading up to one of the two possible present values. One of these maximum likelihood paths must be the optimal path. As explained at page 499 of Ferguson, the state of the received code sequence is classified as being one of a plus (+) merge state, minus (−) merge state, and no merge state depending on its trellis pattern. The code sequence is decoded, that is, its values are determined, in accordance with the state at that time and at neighboring times.

More particularly, in Ferguson's technique, only when both the type of the preceding or most recent merge, that is, a (+) or (−) merge, and the type ((+) or (−)) of the present merge are known is it possible to decode with certainty the code sequence points between the most recent merge and the present merge. That is, decoding cannot occur with certainty when the present state is a no merge state.

Hitherto, when the no merge state has continued or persisted for multiple times, the value of the original code sequence has been estimated and stored in a buffer, and when the next plus (+) merge or minus (−) merge occurs, the values in the buffer have been updated, if necessary, and output as the recovered code sequence.

However, when the no merge state continues for a sufficiently long period of time, the number of estimated code values exceeds the capacity or size of the buffer. The oldest estimated values are then typically output as recovered data. When the next (+) or (−) merge occurs, the estimated values still in the buffer can be corrected, if necessary, but it is impossible to correct the values which have been output as recovered code values. Therefore, an error occurs in the recovered code sequence.

Additionally, in this situation, Ferguson's technique is defined such that an additional error occurs in the recovered code sequence when the stored estimated values are corrected after occurrence of a (+) or (−) merge state. Therefore, as explained at page 502 of Ferguson, a total of two errors may occur in the recovered code sequence when the reception buffer overflows.

OBJECTS AND SUMMARY OF THE INVENTION

An object of the present invention is to provide a decoding technique which avoids the aforementioned disadvantages of the prior art.

Another object of the present invention is to provide a decoding technique which can reduce the error rate when the no merge state continues for a time period which exceeds the capacity of a reception buffer.

In accordance with an aspect of this invention, a Viterbi decoding method or apparatus receives a reception code produced by precoding a transmission code and transmitting the precoded transmission code through a partial response transmission path, and detects the generation of one of a plus merge and a minus merge as a present merge. A provisional value for the transmission code corresponding to the reception code is estimated as a function of whether the value of the reception code lies within a predetermined range, and the provisional value is stored in a buffer. A decoded value for the transmission code is obtained as a function of whether a preceding merge is a plus or minus merge and the present merge is a plus or minus merge. The provisional value in the buffer is updated with the decoded value.

In accordance with another aspect of the invention, a Viterbi decoding method or apparatus receives a reception code produced by precoding a transmission code and transmitting the precoded transmission code through a partial response transmission path, and detects the generation of one of a plus merge and a minus merge as a present merge. A provisional value for the transmission code corresponding to the reception code is estimated as a function of whether a difference between metrics of maximum likelihood paths respectively leading to possible transmission code values lies within a predetermined range, and the provisional value is stored in a buffer. As used herein, metric refers to an estimated likelihood of a reception code value. A decoded value for the transmission code is obtained as a function of whether a preceding merge is a plus or minus merge and the present merge is a plus or minus merge. The provisional value in the buffer is updated with the decoded value.

The above, and other objects, features and advantages of the present invention will be apparent in the following detailed description of the preferred embodiments of the present invention when read in conjunction with the accompanying drawings in which corresponding parts are identified by the same reference numeral.

DETAILED DESCRIPTION OF THE PREFERRED EMBODIMENTS

Figures 1, 2A, 2B, 2C:
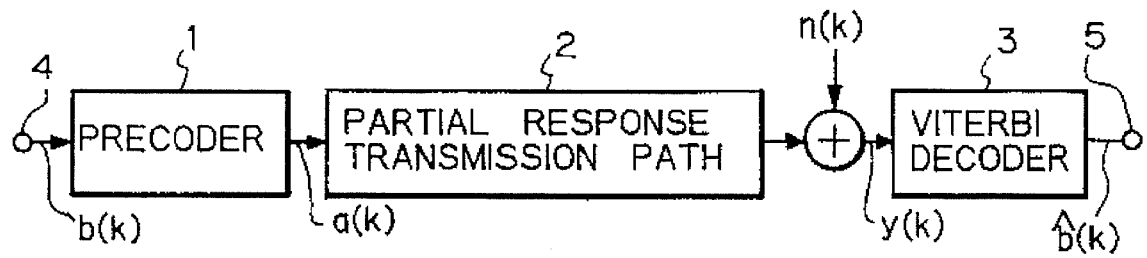
FIG. 1 is a block diagram showing an example of a system to which the present invention can be applied.
FIGS. 2A to 2C are schematic diagrams which are used in explaining of an embodiment of the present invention.

FIG. 1 shows an example of a system in which the present invention can be applied. FIG. 1 shows input terminal 4, precoder 1, partial response transmission path 2, Viterbi decoder 3, and output terminal 5.

A transmission code series b(k), having one of the values "0", "1" at discrete times (k) is supplied to the input terminal 4, which in turn supplies the series b(k) to precoder 1. The precoder 1 is adapted to precode the transmission code series b(k) to produce an intermediate code series a(k), in accordance with the following equations:

$$a(k)=a(k-1) \oplus b(k) \qquad \text{(eq. 1A)}$$

$$a(-1)=1 \qquad \text{(eq. 1B)}$$

where $\oplus$ indicates modulo 2 addition.

From (eq. 1A), the present intermediate code value a(k) can be determined from the transmission code b(k) and a preceding intermediate code a(k−1), as shown in Table 1:

TABLE 1

| b(k) | a(k − 1) | a(k) |
|------|----------|------|
| 0    | 0        | 0    |
| 0    | 1        | 1    |
| 1    | 0        | 1    |
| 1    | 1        | 0    |

The code sequence a(k) is supplied to partial response transmission path 2 which functions to differentially encode the sequence a(k) and to add white noise n(k), having a distribution $N(0, \sigma^2)$ thereto to produce a reception code series y(k), represented by the following equation:

$$y(k)=a(k)-a(k-1)+n(k) \qquad \text{(eq. 2)}$$

The series y(k) is supplied to Viterbi decoder 3 which serves to decode or recover the transmitted code series b(k) from the received code series y(k), and to output the decoded code series b(k) to output terminal 5. More specifically, from the relation defined in Table 1, a trellis diagram can be constructed. The Viterbi decoder 3 serves to estimate the transmitted code sequence by determining the maximum likelihood path on the trellis diagram using the Viterbi algorithm.

A state reaches "1" at time j, that is, a(j)=1, either when the preceding state is set to "1", a (j−1)=1, and the transmitted code is set to "0", b(j)=0 (second row of Table 1), or when the preceding state is set to "0", a(j−1)=0 and the transmitted code is set to "1", b(j)=1 (third row of Table 1. The maximum likelihood path among these paths, namely, the path having a maximum metric (discussed below) is selected. Among the paths which reach a(j)=1, the path which maximizes the metric is called a plus _path (j).

Similarly, a state reaches "0" at time j, that is, a(j)=0, either when the preceding state is set to "0" and a(j−1)=0, the transmitted code is set to "0", b(j)=0 (first row of Table 1), or when the preceding state is set to "1", a(j−1)=1 , and the transmitted code is set to "1", b(j)=1 (fourth row of Table 1). The maximum likelihood path among those paths, namely, the path having the maximum metric is selected. Among the paths which reach a(j)=0, the path which maximizes the metric is called a minus_path (j).

Assuming that the maximum likelihood path which reaches the state "1" at time j, that is, the plus_path (j) and the maximum likelihood path which reaches the state "0"at time j, that is, the minus_path (j) are known, then, at the next time j+1, three patterns are possible, a plus (+) merge state, a minus (−) merge state, and a no merge state, as shown in FIGS. 2A–2C, also referred to herein as a (+) merge pattern, a (−) merge pattern and a no merge pattern.

As shown in FIG. 2A, the plus (+) merge state begins from the plus_path(j), having value "1" at time j, and comprises branches to the values "1" and "0" at time j+1. In other words, in the plus (+) merge state, the plus_path (j+1) and the minus_path(j+1) both stem from the plus_path (j).

(+) merge:

[plus_path (j+1)]=[plus_path (j), 1]and

[minus_path (j+1)]=[plus_path (j), 0]

As shown in FIG. 2B, the no merge state is simply a continuation of the previous state, that is, the plus (+) merge state at time j reaches the value "1" at time j+1, while the minus (−) merge state at time j reaches the value "0" at time j+1. In other words, in the no merge state, the plus_path (j+1) stems from the plus_path (j) and the minus_path (j+1) stems from the minus_path (j).

no merge

[plus_path (j+1)]=[plus_path (j), 1]and

[minus_path (j+1)]=[minus_path (j), 0]

As shown in FIG. 2C, the minus (−) merge state begins from the minus_path(j), having value "0" at time j, and comprises branches to the values "1" and "0"at time j+1. In other words, in the minus (−) merge state, the plus_path (j+1) and the minus_path(j+1) both stem from the minus_path (j).

(31 ) merge: [plus_path (j+1)]=[minus_path (j), 1]and

[minus_path (j+1)]=[minus_path (j), 0]

In Ferguson's technique, the state a(k) of the maximum likelihood path is decoded from the reception code before performing decoding complementary to the precoding which was performed. There is a possibility that two errors can occur due to buffer overflow.

Figure 2D:
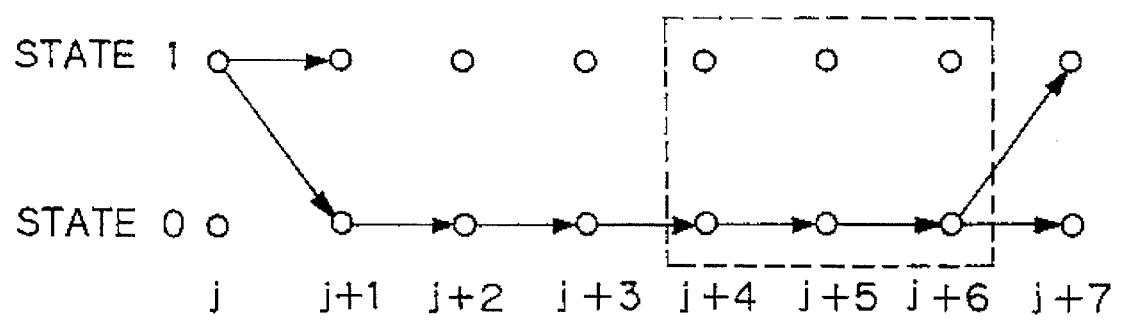
FIG. 2D is a schematic diagram used in illustrating an example of a decoding operation.

For example, FIG. 2D shows a plus (+) merge state at time j, followed by a no merge state during times j+1to j+5, followed by a minus (−) merge state at time j+6. The decoding results of the code a(k) and transmission code b(k) should be as follows:

| Time | j | j+1 | j+2 | j+3 | j+4 | j+5 | j+6 |
|------|---|-----|-----|-----|-----|-----|-----|
| a(k) | 1 | 0   | 0   | 0   | 0   | 0   | 0   |
| b(k) | x | 1   | 0   | 0   | 0   | 0   | 0   |

Using Ferguson's technique, while the no merge state continues, an estimate is made of the recovered data. If the next merge state is erroneously estimated, the erroneous decoding result is continuously sent until the actual next merge is generated, at which time the correctness of the estimate can be assessed. If the estimate of the next merge state is seen to be wrong, all of the decoding results in the buffer are inverted, thereby correcting the estimated values. If no buffer overflow has occurred, then there is no error. However, if the buffer has overflowed, two errors can occur.

In the example of FIG. 2D, at time j+1, the correct state is seen to have a value of "0" but this state may be erroneously estimated using Ferguson's technique as having the value "1". If the buffer has a capacity of only three code values, an overflow occurs, and at time j+4 the value "1", which was incorrectly estimated at time j+1, is output.

Similarly, at times j+5 and j+6, the values "1" and "1", which were incorrectly estimated at times j+2 and j+3, respectively, are output:

| Time | j | j + 1 | j + 2 | j + 3 | j + 4 | j + 5 | j + 6 |
|---|---|---|---|---|---|---|---|
| estimated_a(k) | — | — | — | — | 1 | 1 | 1 |
| a(k) | | 1 | 1 | 1 | | | |

When the minus merge is detected at time j+6, it will be understood that the state for times j+1 to j+6 should be "0", so the values estimated at times j+4 through j+6 and still in the buffer are inverted:

| Time | j | j + 1 | j + 2 | j + 3 | j + 4 | j + 5 | j + 6 |
|---|---|---|---|---|---|---|---|
| estimated_a(k) | — | — | — | — | 0 | 0 | 0 |
| a(k) | | 1 | 1 | 1 | | | |

Thus, the following code series will be output for times j through j+6: a(k)={1,1,1,1,0,0,0}.

Using Ferguson's technique, the corresponding estimated or recovered values of the transmission series are: b(k)={X, 0,0,0,1,0,0}. Two errors are present in this sequence. The first error occurs when the incorrectly estimated a(k) is used at time j+1. The second error occurs when the estimated a(k) is inverted to the correct value at time j+4. In the following table, * denotes an error.

| Time | j | j + 1 | j + 2 | j + 3 | j + 4 | j + 5 | j + 6 |
|---|---|---|---|---|---|---|---|
| a(k) | 1 | 1 | 1 | 1 | 0 | 0 | 0 |
| b(k) | x | 0* | 0 | 0 | 1* | 0 | 0 |

In the present invention, the transmission code b(k) is decoded from the reception code, so that the number of errors due to buffer overflow does not exceed one. That is, the present invention eliminates the need found in the prior art to invert a series of estimated values stored in the reception buffer.

More particularly, in the present invention, when the no merge state is generated, the decoded value for b(k) is set to "0", so the number of errors which will occur is no more than one, which can be represented as follows, with * denoting an error:

| Time | j | j + 1 | j + 2 | j + 3 | j + 4 | j + 5 | j + 6 |
|---|---|---|---|---|---|---|---|
| a(k) | — | — | — | — | — | — | — |
| b(k) | x | 0* | 0 | 0 | 0 | 0 | 0 |

As explained above, the path having a maximum metric is selected. The metric for a path, that is, the estimated likelihood of the series of reception code values comprising the path, can be obtained in accordance with the following equations:

$$2 \sum_{k=0}^{j} y(k)(a(k) - a(k-1)) - \sum_{k=0}^{j} (a(k) - a(k-1))^2 \quad \text{(eq. 3A)}$$

$$a(-1) = 1 \quad \text{(eq. 3B)}$$

From (eq. 3A), an increase or decrease in the amount of the metric when the state changes is as shown in Table 2.

TABLE 2

| a(j − 1) | a(j) | Increase or decrease of metric |
|---|---|---|
| 1 | 0 | −2y(j) − 1 |
| 1 | 1 | 0 |
| 0 | 0 | 0 |
| 0 | 1 | 2y(j) − 1 |

That is, when the state changes from "1" to "0", the metric decreases in an amount (−2y(j)−1). When the state changes from "0" to "1", the metric increases in an amount (2y(j)−1). When the state does not change, that is, remains at "1" or "0", the metric does not change, i.e., experiences zero increase and zero decrease.

Selection of one of the plus (+) merge state, the minus (−) merge state or the no merge state at time j+11 is determined by a metric Fp(j) of the plus_path (j), a metric Fm(j) of the minus_path (j), and the increase and decrease amounts of the metrics in a period of time from time j to time j+1. Defining "delta" as the difference between the metric Fp of the plus_path and the metric Fm of the minus_path, at a time j, $$\Delta(j) = Fp(j) - Fm(j)$$

pattern selection conditions at time j+1 are shown in Table 3.

TABLE 3

| Conditions | Pattern |
|---|---|
| Δ(j) > 2y(j + 1) + 1 | (+) merge |
| 1 > Δ(j) − 2y(j + 1) > −1 | no merge |
| Δ(j) < 2y(j + 1) − 1 | (−) merge |

Similarly, when the (+) merge or (−) merge occurs at a time j, the path before time j is common. Therefore, for Δ(j+1), it is sufficient to consider only the difference contributed to the metric of the path between the time j and the time j+1.

In case of the no merge, since the amounts contributed to the metric by both of the plus_path and the minus_path are equal to 0, the value of Δ is preserved. Therefore, the difference Δ(j+1) between the metrics Fp(j+1) and Fm(j+1) is updated in accordance with Table 4.

TABLE 4

| Pattern at j | Δ(j + 1) |
|---|---|
| (+) merge | 2y(j + 1) + 1 |
| no merge | Δ(j) |
| (−) merge | 2y(j + 1) − 1 |

A decoding method for obtaining the maximum likelihood path a(k) in accordance with the most recent merge and the next merge will now be described.

At an arbitrary time j, the candidates for the maximum likelihood path are the plus_path (j) and the minus_path (j). If the most recent merge occurred at time j−i, the plus_path and the minus_path both include a (0), a(1), ..., a(j−i). That is, the decoded values have already been specified through time j−i.

If the no merge state is generated from time j−i+1 until time j, all of the values of the plus_path (j) are equal to "1" and all of the values of the minus_path (j) are equal to "0" during this time interval. Selection of one of these paths as the maximum likelihood path occurs at the next merge.

If the (+) merge is generated at time j+k as the next merge, then the plus_path(j+k) is selected and the decoding results a(j−i+1) to a(j+k) are equal to "1". If the (−) merge is generated at time j+k as the next merge, the minus_path (j+k) is selected and the decoding results a(j−i+1) to a(j+k) are equal to "0".

Once the path a(k) has been determined as described above, the transmission code b(k) is decoded as follows.

Upon transmission, as shown by (eq. 1A), the precoder 1 forms the intermediate code a(k) by modulo 2 addition of the transmission code b(k) and the preceding code a(k−1). Therefore, b(k)=1 when a(k) and a(k−1) differ, which occurs when either the (+) merge is the most recent merge and the (−) merge is the next merge, or the (−) merge is the most recent merge and the (+) merge is the next merge. Otherwise, b(k)=0, as shown in the decoding rules of Table 5.

TABLE 5

| merge at time k − 1 | next merge | b(k) |
| --- | --- | --- |
| (+) | (−) | 1 |
| (−) | (+) | 1 |
| (+) | (+) | 0 |
| (−) | (−) | 0 |
| no merge | | 0 |

In this method, the value of b(k) cannot be determined until the next merge is generated. At each time from the most recent merge until the next merge, a provisional estimated value is produced and stored in a buffer. When the subsequent merge is generated, the proper values can be determined, and, if necessary, the estimated values may be corrected.

An embodiment of the present invention in which the provisional estimated value for b(k) is produced by comparison of the received code with a threshold value will now be described with reference to FIG. 3.

Referring to (eq. 2), it will be seen that y(k) includes the term (a(k)−a(k−1)). The relationship between (a(k)−a(k−1)) and b(k) is given by (eq. 1A). The noise n(k) is white noise having a distribution of $N(0,\sigma^2)$. Therefore, using a properly chosen threshold value th, the estimated decoded value b(k) may be obtained by the following rules:

If $y(k)>th$ or $y(k)<-th$, then $b(k)=1$     (rule 1A)

If $-th<y(k)<th$, then $b(k)=0$     (rule 1B)

Figure 3:
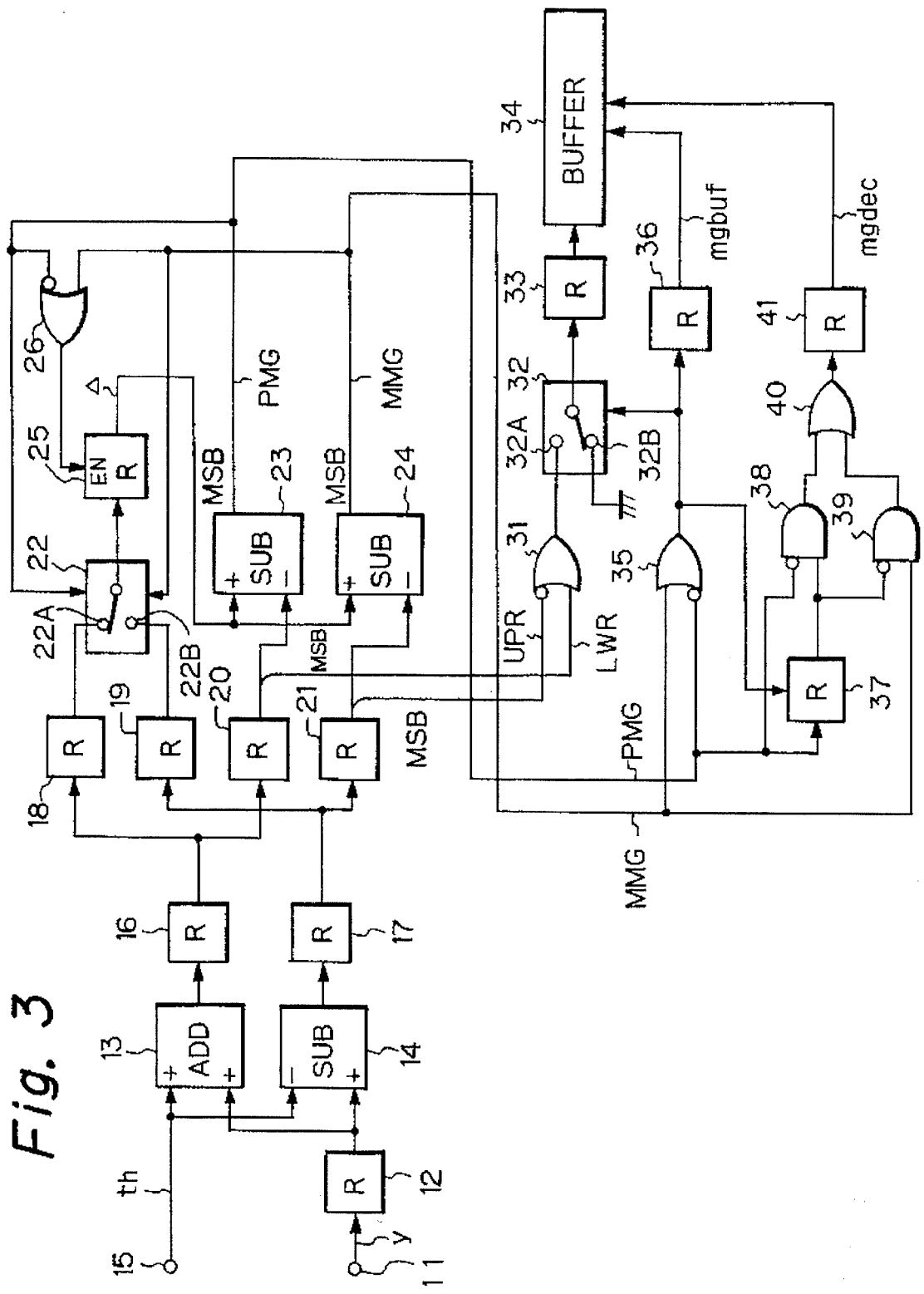
FIG. 3 is a block diagram of an embodiment of the present invention.

FIG. 3 shows an apparatus for decoding using rules 1A–1B to obtain provisional estimates of the decoded values.

The received code y is supplied to an input terminal 11 which supplies the code y to register 12, which serves to supply the code y to an adder 13 and a subtracter 14. The threshold value th, which is equal to 0.5 in this embodiment, is supplied to an input terminal 15 which supplies the value th to the adder 13 and subtracter 14. The adder 13 is adapted to add the reception code y and the threshold value th using twos complement arithmetic to produce the value y+th, and to supply this value to a register 16 that serves to supply the value to registers 18 and 20. The subtracter 14 is adapted to subtract the threshold value th from the reception code y using twos complement arithmetic to produce the value y−th, and to supply this value to a register 17 that serves to supply this value to registers 19 and 21.

The register 18 is adapted to supply the value y+th to a terminal 22A of a switching circuit 22. The register 19 is adapted to supply the value y−th to a terminal 22B of the switching circuit 22. The switching circuit 22 functions to select one of these values as the difference Δ=Fp−Fm in accordance with one of two switch control signals, and to supply this difference to a register 25 that serves to supply the difference to subtracters 23 and 24.

The register 20 supplies the value y+th to the subtracter 23 that functions to obtain the value Δ−(y+th), and to output the MSB (sign bit) of this value as a plus (+) merge signal PMG. The register 21 supplies the value y−th to the subtracter 24 that functions to obtain the value Δ−(y−th), and to output the MSB (sign bit) of this value as a minus (−) merge signal MMG. Generation of the (+) merge or the (−) merge can be detected from the signals PMG and MMG as shown in Table 6.

TABLE 6

| PMG | MMG | Pattern |
| --- | --- | --- |
| L | L | (+) merge |
| H | L | no merge |
| H | H | (−) merge |

The signals PMG and MMG are supplied to the switching circuit 22 as the aforementioned switch control signals. When the (+) merge is generated, terminal 22A is selected. When the (−) merge is generated, terminal 22B is selected. When the no merge state is generated, the unchanged difference value remains in the register 25.

The signal PMG is supplied to an inverting terminal of OR gate 26, and the signal MMG is supplied to another terminal of OR gate 26. When the (+) merge or the (−) merge is generated, the OR gate 26 operates to logically OR the signals supplied thereto to produce an enable signal, and to apply the enable signal to the register 25 to enable updating of the Δ value stored therein.

The signal PMG is supplied to an inverting terminal of an OR gate 35. The signal MMG is supplied to another input terminal of the OR gate 35. The OR gate 35 produces a merge control signal having one signal level, such as "H", when either a (+) merge or a (−) merge is generated, and another signal level, such as "L", when no merge is generated. The merge control signal is applied to a register 36 that is adapted to supply the merge control signal stored therein as a signal mgbuf to a buffer 34.

The register 20 supplies the MSB of the value y+th as a signal LWR to an OR gate 31. The register 21 supplies the MSB of the value y−th as a signal UPR to an inverting input of the OR gate 31. The signals LWR and UPR indicate the relation between the reception code y and the threshold level th, as shown in Table 7.

TABLE 7

| UPR | LWR | Relation |
| --- | --- | --- |
| L | L | y(k) > th |
| H | L | −th < y(k) < th |
| H | H | y(k) < −th |

That is, when the signals LWR and UPR are set to "L", the reception code y is larger than the threshold value th. When the signal LWR is set to "L" and the signal UPR is set to "H", the reception code y lies between the values −th and th. When the signals LWR and UPR are set to "H", the reception code y is smaller than the threshold level −th. It will be seen that the relation described in Table 7 corresponds to the conditions of the estimating rules 1A and 1B.

The OR gate 31 functions to supply one signal level, such as "H", for the conditions y(k)>th and y(k)<−th, and another signal level, such as "L", for the condition −th<y(k)−th, corresponding to the rules 1A and 1B above. The signal from the OR gate 31 is applied to a terminal 32A of a switching circuit 32. A signal level "L" is supplied to a terminal 32B of the switching circuit 32. The switching circuit 32 applies one of the inputs supplied thereto to a register 33 in accordance with the merge control signal. Specifically, when the merge control signal indicates a (+) or (−) merge, the terminal 32A is selected, and when the merge control signal indicates no merge, the terminal 32B is selected. The register 33 supplies the value held therein to the buffer 34 as an estimated decoded value b.

The merge control signal is applied to a register 37 as an enable signal. The signal PMG, having the value "L" when a (+) merge is generated and "H" when a (−) merge is generated, is applied to the register 37. When the (+) merge or (−) merge is generated, the signal PMG is stored in the register 37. When no merge is generated, the value held in register 37 remains unchanged.

The value in the register 37 is supplied as a previous merge indicator to one input terminal of an AND gate 38, and the signal PMG is supplied to an inverting input terminal of the AND gate 38. The previous merge indicator is supplied to an inverting input terminal of an AND gate 39, and the signal MMG is supplied to another input terminal of the AND gate 39. Outputs of the AND gates 38 and 39 are supplied to an OR gate 40, which serves to supply a signal at one level, such as "H", when either the previous merge is the (−) merge and the present merge is the (+) merge or when the preceding merge is the (+) merge and the present merge is the (−) merge. The output of the OR gate 40, which is in accordance with the decoding rules shown in Table 5, is supplied to a register 41, which serves to supply it as a signal mgdec to the buffer 34.

Figure 4:
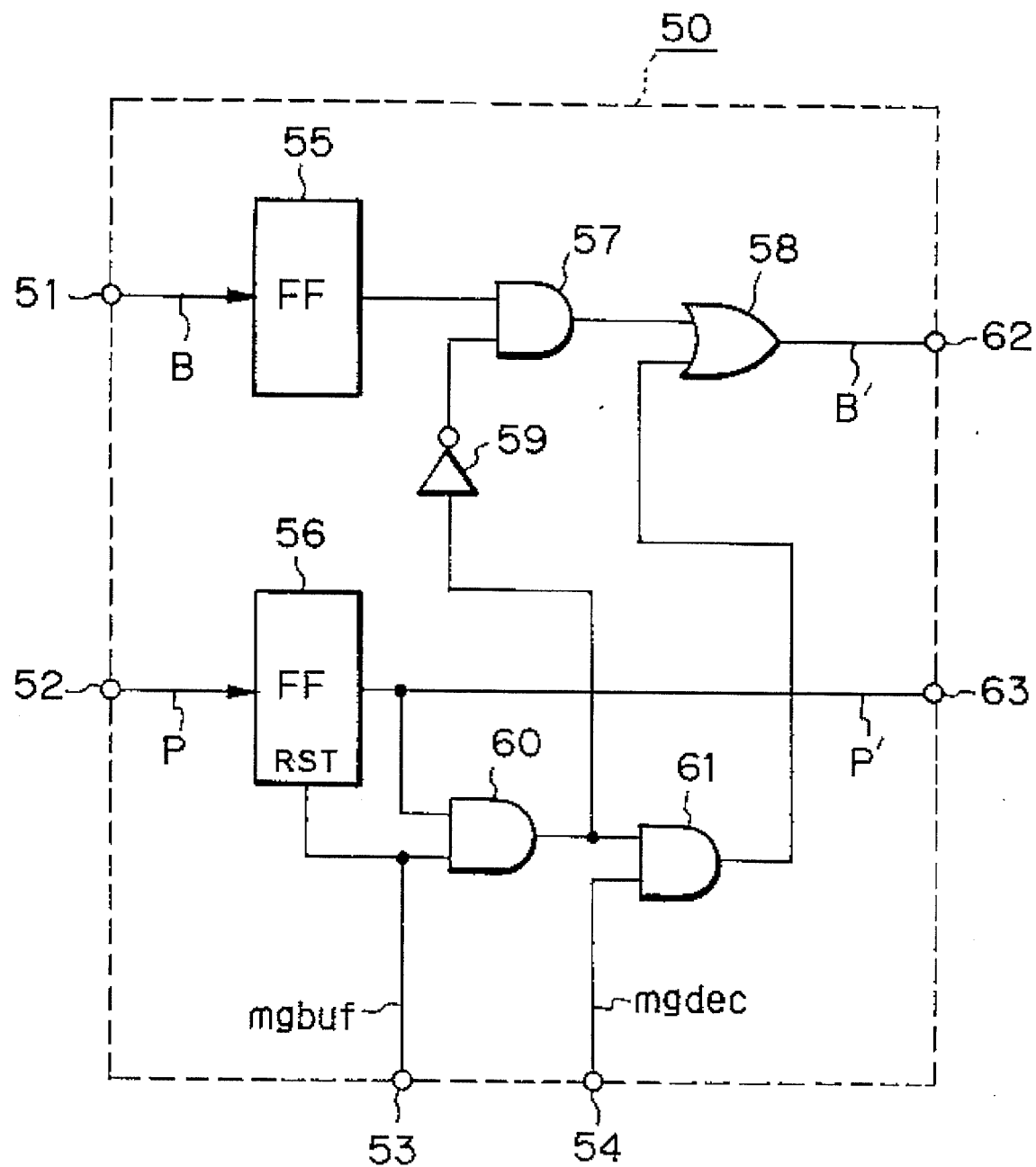
FIG. 4 is a block diagram of a buffer cell used in the embodiment of the present invention shown in FIG. 3.

FIG. 4 shows a buffer cell 50, which may be cascade connected with, for example, 30 other similar buffer cells to form the buffer 34. The actual number of buffer cells may be varied.

Buffer data B, pointer data P indicating whether the buffer data B was obtained when a merge was generated, the signal mgbuf, and the signal mgdec are respectively supplied to input terminal 51, 52, 53 and 54 of the buffer cell 50 shown in FIG. 4.

The input terminal 52 supplies the pointer data P to a flip-flop 56 which is adapted to store the pointer P. The input terminal 53 supplies the signal mgbuf to a reset terminal of the flip-flop 56. An output of the flip-flop 56 is supplied to an output terminal 63 and to one input terminal of an AND gate 60. The signal mgbuf is supplied to another input terminal of the AND gate 60. An output of the AND gate 60 is supplied to an inverter 59 and is supplied to one input terminal of the AND gate 61.

The input terminal 54 supplies the signal mgdec to another input terminal of the AND gate 61. An output of the AND gate 61 is applied to an input of an OR gate 58.

The input terminal 51 supplies the buffer data to a flip-flop 55 which is adapted to store the decoded information B. An output of the flip-flop 55 is supplied to one input terminal of an AND gate 57. An output of the inverter 59 is supplied to another input terminal of the AND gate 57. An output of the AND gate 57 is supplied to another input terminal of the OR gate 58. An output of the OR gate 58 is supplied to an output terminal 62.

When no merge is generated, outputs of the flip-flops 55 and 56 are passed unchanged to the next stage of the buffer 34.

When the merge is generated, the signal mgbuf from the input terminal 53 is set to "H". When P is set to "H", the decoding result is rewritten in accordance with the value of the signal mgdec.

Additional embodiments of the present invention in which the provisional estimated value for b(k) is produced based on the difference delta ($\Delta$) between the plus_path metric Fp and the minus_path metric Fm will now be described with reference to FIGS. 5–9.

If either the plus (+) merge or the minus (−) merge is generated at time j, $\Delta(j+1)$ is given by the following:

$$\begin{aligned}\Delta(j+1) &= 2y(j+1) + 1\\ &= 2(a(j+1) - a(j) + n(k)) + 1\\ &= (2a(j+1) - 1 + n(k))\end{aligned}$$

Thus, the probability that $a(j+1)=1$ when $\Delta(j+1)>0$ is large, and the probability that $a(j+1)=0$ when $\Delta(j+1)<0$ is large. Therefore, the following rules may be used for estimating the provisional decoded value b(k):

If the (+) merge is generated at time k−1, and if $\Delta(k)>0$, then b(k)=0, else if $\Delta a(k)<0$, then b(k)=1. (rule 2A)

If the (−) merge is generated at time k−1, and if $\Delta(k)>0$, then b(k)=1, else if $\Delta(k)<0$, then b(k)=0. (rule 2B)

If no merge is generated at time k−1, then b(k)=0. (rule 2C)

A method for producing the provisional estimated values using rules 2A–2C will now be described with reference to FIGS. 5–8.

Figure 5:
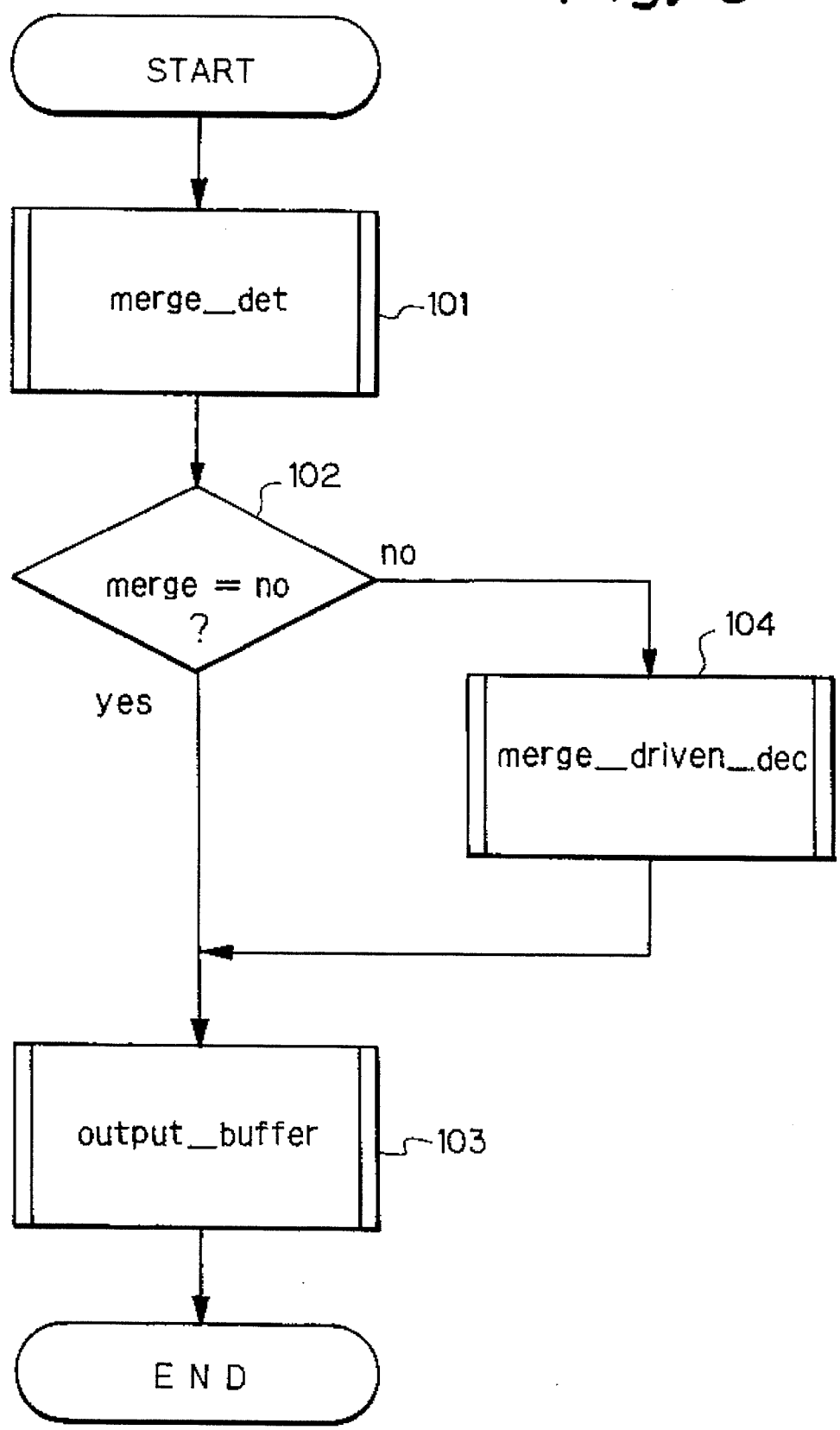
FIGS. 5–8 are flowcharts used in explaining another embodiment of the present invention.

FIG. 5 shows a main routine of a decoding process using rules 2A–2C. As shown in FIG. 5, at step 101, a merge detecting process is executed.

Figure 6:
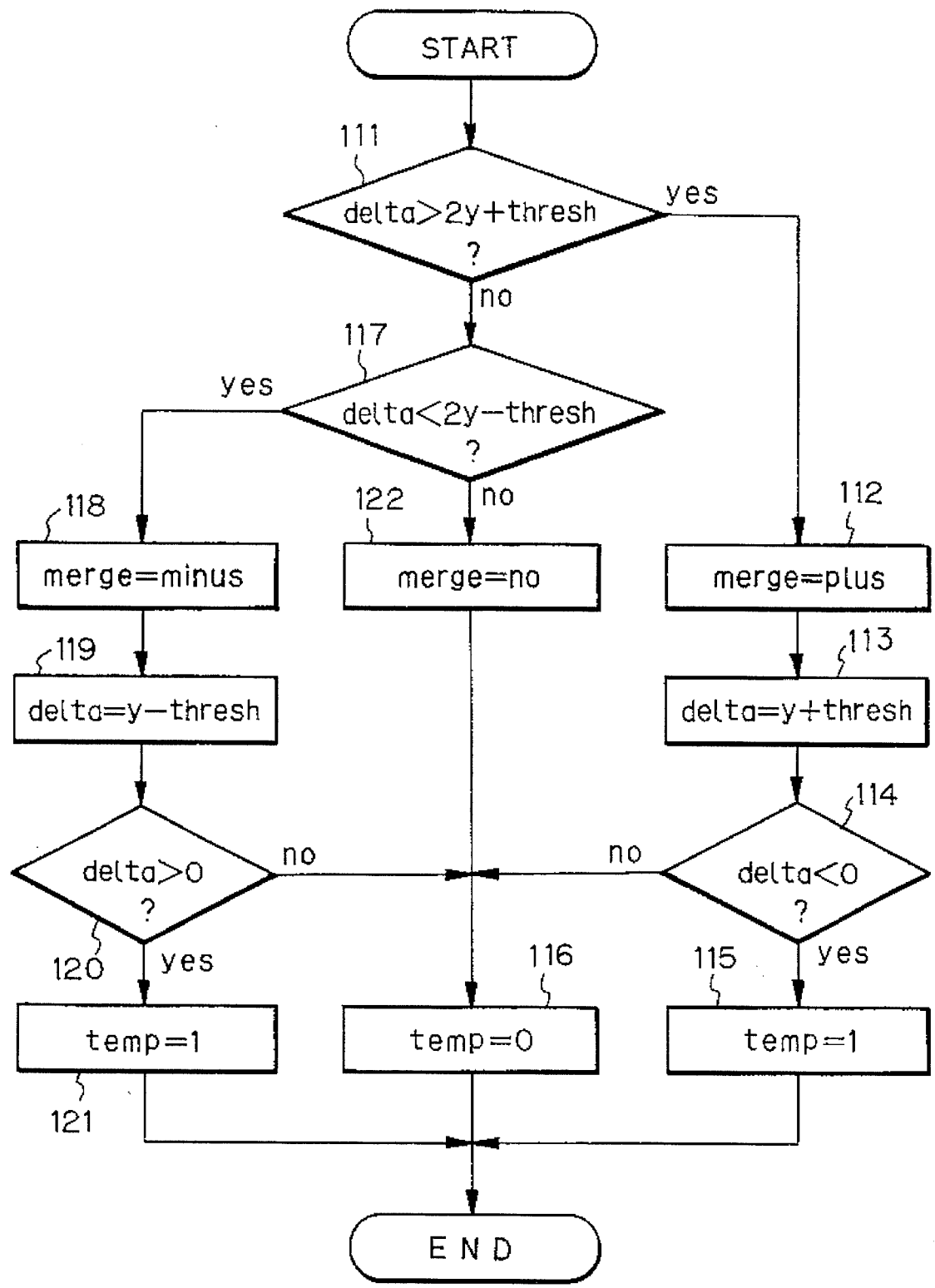

FIG. 6 shows the merge detecting process of step 101 of FIG. 5 in detail. In accordance with Table 3, at steps 111 and 117, the difference $\Delta$ for the previous time is compared with the received code to determine the appropriate pattern, that is, (+) merge, (−) merge or no merge. Depending on which pattern is determined to exist at steps 118, 122 and 112, the difference $\Delta$ for the present time is set in accordance with Table 4, at steps 119, none and 113, respectively. That is, if the no merge state is determined to exist, the $\Delta(k-1)$ is retained as the value for $\Delta(k)$. At steps 120 and 121, 116, and 114 and 115, a temporary value is estimated in accordance with the rules 2A–2C.

Returning to FIG. 5, after the merge detecting process, at step 102, a check is made to see if there is a no merge state. If there is other than a no merge state, that is, a (+) merge or (−) merge, then at step 104 a decoding process is executed, and the output buffer process is performed at step 103. If there is a no merge state, then at step 103, an output buffer process is executed.

Figure 7:
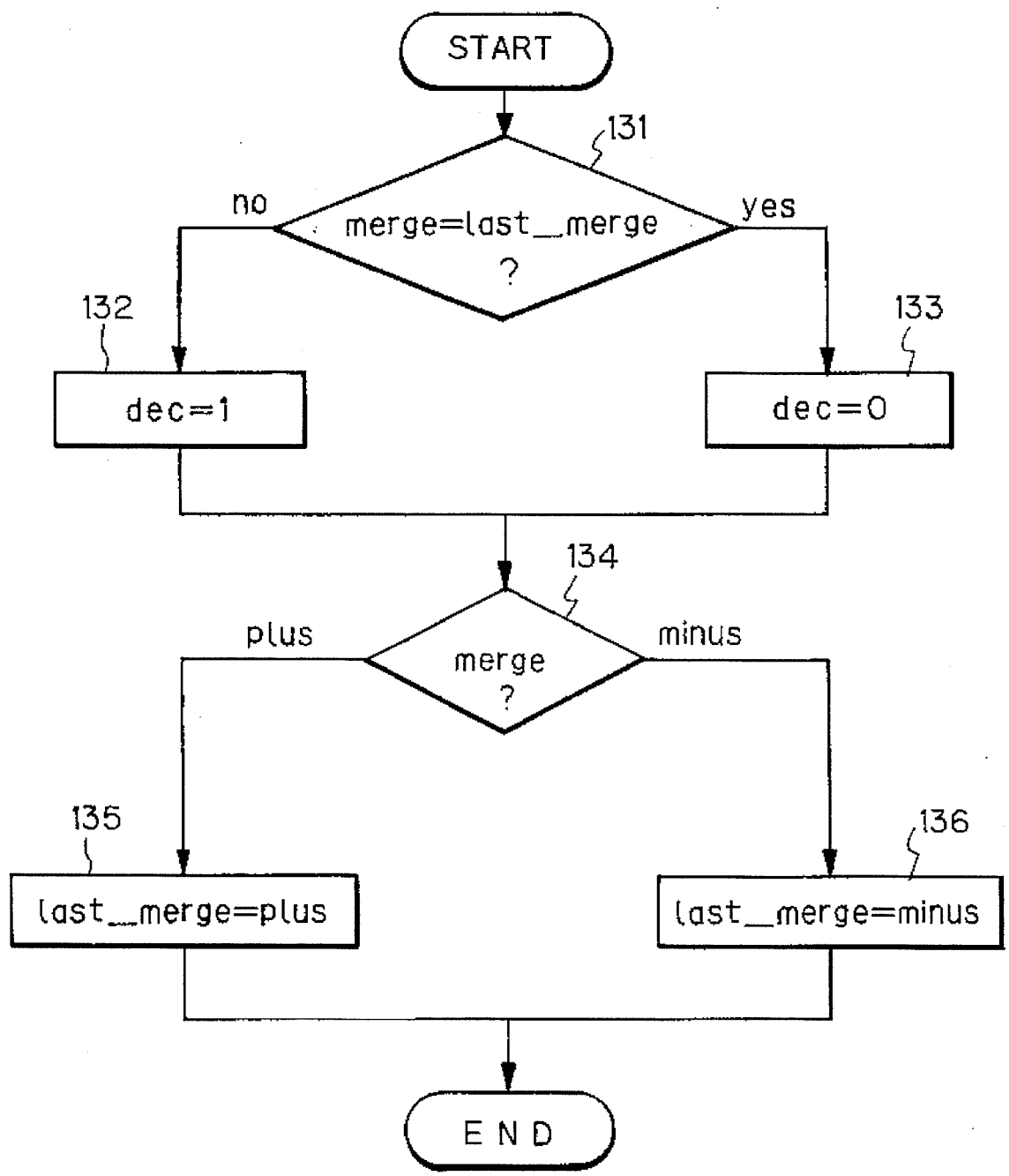

FIG. 7 shows the decoding process of step 104 of FIG. 5 in detail. At step 131, a check is made to see if the preceding merge and the present merge are the same. When the preceding merge and the present merge are different types, at step 132, the decoding result for b(k) is set to "1" in accordance with the decoding rules of Table 5. When the preceding merge and the present merge are the same type, at step 133, the decoding result for b(k) is set to "0" in accordance with the decoding rules of Table 5. At step 134, the type of merge is determined, and at steps 135 and 136, the last merge type is appropriately updated.

Figure 8:
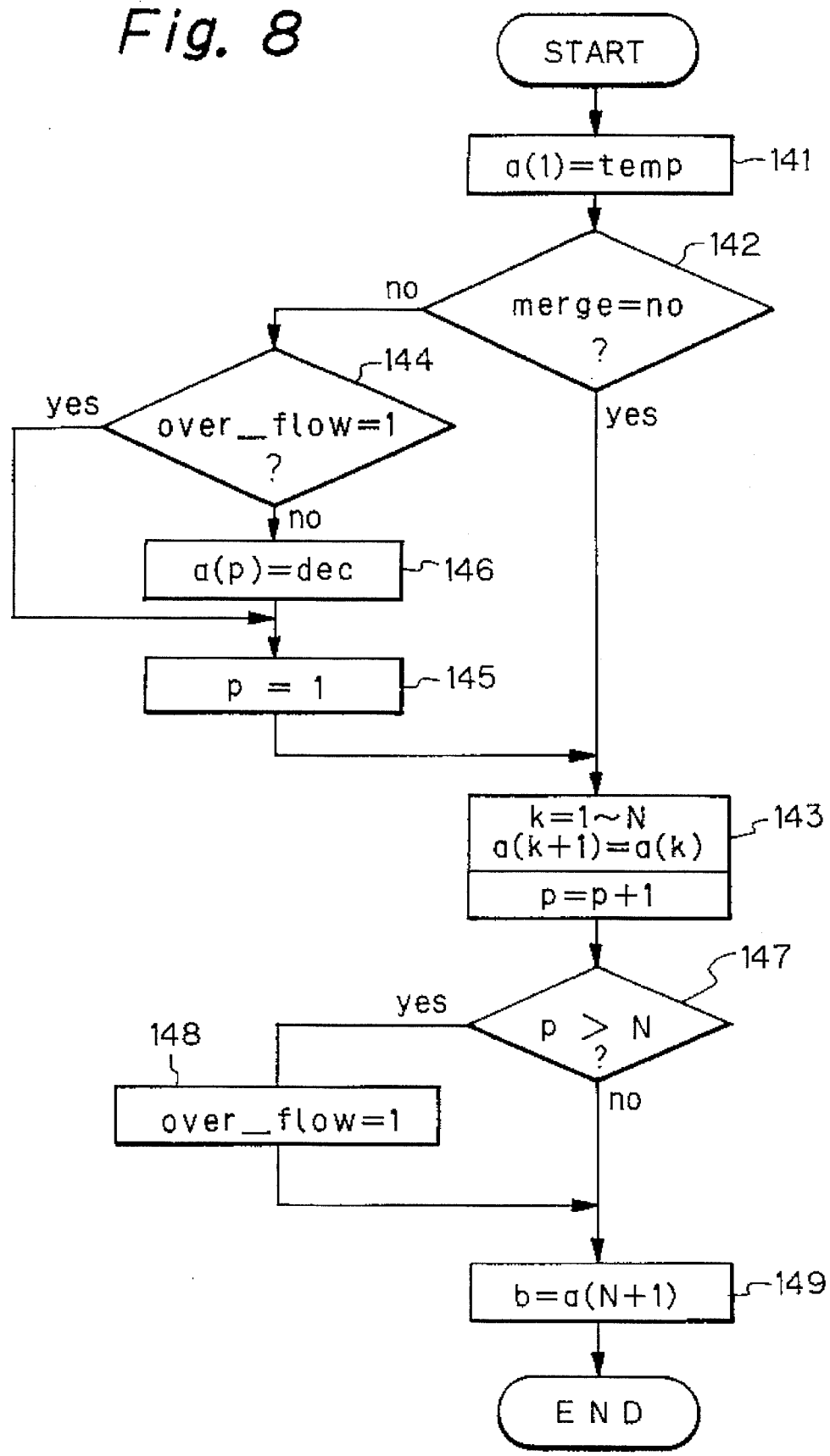

FIG. 8 shows the output buffer processing step 103 of FIG. 5. At step 141, the most recent value in the buffer a(1) is set to the temporary value estimated in one of steps 121, 116 and 115 of FIG. 6. At step 142, a check is made to see if a merge has been generated. If there is no merge, at step 143, the buffer contents shifted.

If there is a (+) or (−) merge, at step 144 of FIG. 8, an overflow flag is checked. If the overflow flag is equal to "1", at step 145, a pointer is set to "1", and then at step 143, the buffer contents are shifted. If the overflow flag is not equal to "1", at step 146, the buffer value at the location indicated by the pointer, that is, the buffer position at which the merge was generated, is set to the decoded value obtained at one of steps 132 and 133 of FIG. 7, and then at step 145, the pointer is set to "1", and then at step 143, the buffer contents are shifted.

At step 147 of FIG. 8, the value of the pointer is compared with a predetermined number N, with the capacity of the buffer being a function of N, such as (N+1), to see whether a buffer overflow has occurred. If an overflow has occurred, at step 148, the overflow flag is set to "1". Finally, at step 149, a value for b is output from the buffer.

An apparatus for producing the provisional estimated values using rules 2A–2C will now be described with reference to FIG. 9.

Figure 9:
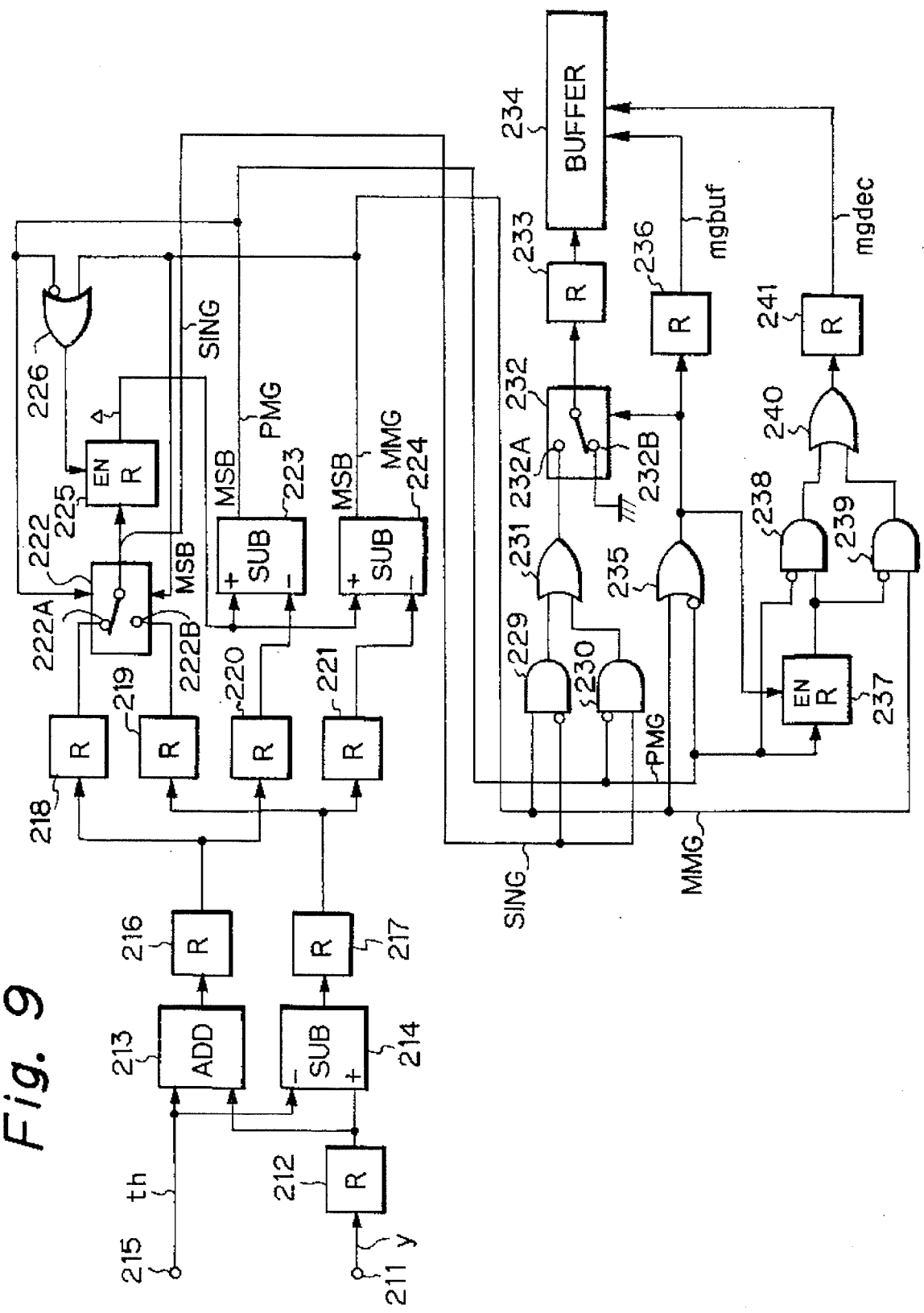
FIG. 9 is a block diagram of yet another embodiment of the present invention.

The elements of FIG. 9 operate in a manner similar to the corresponding elements of FIG. 3 and a description thereof will be omitted for brevity, except as explained herein.

As in the corresponding elements of FIG. 3, the switch 222 of FIG. 9 supplies the value y+th when the (+) merge was generated and supplies the value y−th when the (−) merge was generated. The output value supplied from the switch 222 is applied to register 225, and stored therein as the difference Δ.

Additionally, in FIG. 9, the most significant bit MSB (sign bit) of the output of the switch 222 is supplied as a signal SING to an inverted input terminal of an AND gate 229 and to a non-inverting input terminal of an AND gate 230. The signal MMG is applied to the other input terminal of AND gate 229. The signal PMG is applied to an inverting input terminal of AND gate 230. It will be recalled that generation of the (+) merge or (−) merge can be detected from the signals PMG and MMG in accordance with Table 6.

An output of the AND gate 229 is supplied to one input terminal of an OR gate 231. An output of the AND gate 230 is supplied to another input terminal of the OR gate 231.

Corresponding to rule 2A, when the (+) merge is generated, and if difference Δ between the metrics Fp and Fm is larger than "0" then an output of the OR gate 231 is set to "L", or if the difference Δ is smaller than "0", the output of the OR gate 231 is set to "H".

Corresponding to rule 2B, when the (−) merge is generated, and if difference Δ is larger than "0" then an output of the OR gate 231 is set to "H", or if the difference Δ is smaller than "0", the output of the OR gate 231 is set to "L".

Corresponding to rule 2C, when there is no merge, the output of the OR gate 231 is set to "L".

Although illustrative embodiments of the present invention, and various modifications thereof, have been described in detail herein with reference to the accompanying drawings, it is to be understood that the invention is not limited to these precise embodiments and the described modifications, and that various changes and further modifications may be effected therein by one skilled in the art without departing from the scope or spirit of the invention as defined in the appended claims.

What is claimed is:

1. A Viterbi decoding method, comprising the steps of:
   receiving a reception code produced by precoding a transmission code and transmitting the precoded transmission code through a partial response transmission path;
   detecting the generation of one of a no merge, a plus merge and a minus merge as a present merge;
   estimating a provisional value for the transmission code corresponding to the reception code as zero when the present merge is a no merge and as a function of whether the value of the reception code lies within a predetermined range when the present merge is a plus merge or a minus merge;
   storing the provisional value in a buffer;
   obtaining a decoded value for the transmission code as a function of whether a preceding merge is a plus or minus merge and the present merge is a plus or minus merge; and
   updating the provisional value in the buffer with the decoded value only when the present merge is a plus merge or a minus merge.

2. The method of claim 1, wherein said decoded value is a first predetermined value only when either the preceding merge is a plus merge and the present merge is a minus merge or the preceding merge is a minus merge and the present merge is a plus merge.

3. A Viterbi decoding method, comprising the steps of:
   receiving a reception code produced by precoding a transmission code and transmitting the precoded transmission code through a partial response transmission path;
   detecting the generation of one of a no merge, a plus merge and a minus merge as a present merge;
   estimating a provisional value for the transmission code corresponding to the reception code as zero when the present merge is a no merge and as a function of whether a difference between metrics of maximum likelihood paths respectively leading to possible transmission code values lies within a predetermined range when the present merge is a plus merge or a minus merge;
   storing the provisional value in a buffer;
   obtaining a decoded value for the transmission code as a function of whether a preceding merge is a plus or minus merge and the present merge is a plus or minus merge; and
   updating the provisional value in the buffer with the decoded value only when the present merge is a plus merge or a minus merge.

4. The method of claim 3, wherein said decoded value is a first predetermined value only when either the preceding merge is a plus merge and the present merge is a minus merge or the preceding merge is a minus merge and the present merge is a plus merge.

5. A Viterbi decoding apparatus, comprising:
   means for receiving a reception code produced by precoding a transmission code and transmitting the precoded transmission code through a partial response transmission path;
   means for detecting the generation of one of a no merge, a plus merge and a minus merge as a present merge;
   means for estimating a provisional value for the transmission code corresponding to the reception code as zero when the present merge is a no merge and as a function of whether the value of the reception code lies within a predetermined range when the present merge is a plus merge or a minus merge;
   means for storing the provisional value in a buffer;
   means for obtaining a decoded value for the transmission code as a function of whether a preceding merge is a plus or minus merge and the present merge is a plus or minus merge; and
   means for updating the provisional value in the buffer with the decoded value only when the present merge is a plus merge or a minus merge.

6. The apparatus of claim 5, wherein said decoded value is a first predetermined value only when either the preceding merge is a plus merge and the present merge is a minus merge or the preceding merge is a minus merge and the present merge is a plus merge.

7. A Viterbi decoding apparatus, comprising:

means for receiving a reception code produced by precoding a transmission code and transmitting the precoded transmission code through a partial response transmission path;

means for detecting the generation of one of a no merge, a plus merge and a minus merge as a present merge;

means for estimating a provisional value for the transmission code corresponding to the reception code as zero when the present merge is a no merge and as a function of whether a difference between metrics of maximum likelihood paths respectively leading to possible transmission code values lies within a predetermined range when the present merge is a plus merge or a minus merge;

means for storing the provisional value in a buffer;

obtaining a decoded value for the transmission code as a function of whether a preceding merge is a plus or minus merge and the present merge is a plus or minus merge; and means for updating the provisional value in the buffer with the decoded value only when the present merge is a plus merge or a minus merge.

8. The apparatus of claim 7, wherein said decoded value is a first predetermined value only when either the preceding merge is a plus merge and the present merge is a minus merge or the preceding merge is a minus merge and the present merge is a plus merge.

* * * * *

UNITED STATES PATENT AND TRADEMARK OFFICE
CERTIFICATE OF CORRECTION

PATENT NO. : 5,544,177
DATED : Aug. 6, 1996
INVENTOR(S) : Katsuhito Ishida, Kanagawa, Japan It is certified that error appears in the above-indentified patent and that said Letters Patent is hereby corrected as shown below:

```
Title page,
Please add a second inventor as follows:

[75]  Inventors: Katsuhito Ishida, Kanagawa, Japan, and
      Hajime Inoue, Chiba, Japan
```

Signed and Sealed this

Twenty-sixth Day of November 1996

Attest:

BRUCE LEHMAN

*Attesting Officer*     *Commissioner of Patents and Trademarks*